(12) United States Patent
Tanaka et al.

(10) Patent No.: US 6,687,106 B1
(45) Date of Patent: Feb. 3, 2004

(54) POWER MODULE

(75) Inventors: Takeshi Tanaka, Tokyo (JP); Hiroshi Masunaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/959,209

(22) PCT Filed: Feb. 25, 2000

(86) PCT No.: PCT/JP00/01114

§ 371 (c)(1),
(2), (4) Date: Jan. 7, 2002

(87) PCT Pub. No.: WO01/63764

PCT Pub. Date: Aug. 30, 2001

(51) Int. Cl.$^7$ ................................................. H02H 7/00
(52) U.S. Cl. ............................. 361/101; 361/86; 361/94
(58) Field of Search ........................... 361/2, 159, 218, 361/79, 93.1, 94, 100, 101, 86; 363/106, 177, 56

(56) References Cited

U.S. PATENT DOCUMENTS

| | | | |
|---|---|---|---|
| 4,965,710 A | 10/1990 | Pelly et al. | 363/56 |
| 5,608,595 A | 3/1997 | Gourab et al. | 361/79 |
| 5,808,504 A | 9/1998 | Chikai et al. | 327/434 |
| 6,091,615 A | * | 7/2000 | Inoshita et al. | 362/98 |

OTHER PUBLICATIONS

Kimata, et al. "High Performance Gate Drive Circuit of High Voltage IPMs (HVIPMs)". 1998 IEEE. 0–7803–4489–8/98.

Patent Abstracts of Japan, vol. 017, No. 661 (E–1471), Dec. 7, 1993 & JP 05 218836 A (Fuji Electric Co Ltd), Aug. 27, 1993 *abstract.

Patent Abstracts of Japan, vol. 1995, No. 6, Jul. 31, 1995 & JP 07 086577 A (Mitsubishi Electric Corp), Mar. 31, 1995 *abstract.

* cited by examiner

*Primary Examiner*—Michael Sherry
*Assistant Examiner*—Lawrence Luk
(74) *Attorney, Agent, or Firm*—Sughrue Mion, PLLC

(57) ABSTRACT

A power module including a self arc-extinguishing type semiconductor such as an IGBT and having a function to protect the semiconductor, i.e., to protect the IGBT against a short-circuit current. Even the IGBT having a collector-emitter saturation voltage VCE (sat) set low can be protected against the short-circuit current, by charging a collector-gate junction capacitor (13) quickly, when a sense current IS to flow through a current sense exceeds a set value, to raise a collector voltage VCE quickly thereby to prevent a collector current IC from increasing, by keeping a gate voltage VGE of the IGBT (12) at a voltage rather higher than a threshold voltage, and by turning OFF the IGBT (12) after a predetermined time.

5 Claims, 9 Drawing Sheets

POWER MODULE

TECHNICAL FIELD

This invention relates to a power module (as will be called the "intelligent power module") which includes a self arc-extinguishing type semiconductor such as an insulated gate type bipolar transistor (as will be called the "IGBT": Insulated Gate Bipolar Transistor) and which has a protecting function of the semiconductor.

BACKGROUND OF THE INVENTION

The IGBT is determined in the magnitude of its permissible collector current by the magnitude of a gate voltage so that the collector current becomes the higher for the higher gate voltage. Moreover, the collector-emitter voltage of the IGBT rises the higher as the collector current becomes the higher.

In the collector-gate and the gate-emitter of the IGBT, as shown in FIG. 6, there exist parasitic capacitors Ccg and Cge. Therefore, the relation between a collector-emitter voltage VCE and a gate electrode VGE is expressed by:

$$VGE = \Delta VCE \times Ccg/(Ccg+Cge).$$

Here, $Ccg << Cge$, $$VGE = \Delta VCE \times Ccg/Cge.$$

In short, as the collector current increases, the collector-emitter voltage VCE increases so that the gate voltage VGE increases to increase the collector current and to accelerate the increase in the collector current. When an overcurrent flows through the IGBT, therefore, the collector current is abruptly increased by the aforementioned phenomenon to cause a problem that the IGBT has its turn-OFF allowable current exceeded.

Therefore, a method of preventing the gate voltage from increasing is exemplified by the prior art, as disclosed in Japanese Patent Laid-Open No. 262822/1990. FIG. 7 is a circuit diagram of an essential portion showing the prior art example.

In FIG. 7: reference numeral 27 designates an IGBT; numeral 21 a DC power source for applying a positive voltage to the gate when the IGBT 27 is turned ON; numeral 22 a DC power source for applying a negative voltage to the gate when the IGBT 27 is turned OFF; numeral 23 a transistor for applying a positive voltage to the gate of the IGBT 27 when turned ON; numeral 24 a transistor for applying a negative voltage to the gate of the IGBT 27 when turned ON; numeral 25 a gate-ON resistor for determining the gate voltage rising rate when the IGBT 27 is turned ON; numeral 26 a gate-OFF resistor for determining the gate voltage dropping rate when the IGBT 27 is turned OFF; numeral 28 a gate-emitter voltage limiting circuit of the IGBT 27; numeral 28A a transistor; numeral 28B a capacitor charged in advance with a voltage equal to that of the DC power source 21; numeral 28C a resistor; and numeral 28D a comparator.

When an "H" is inputted as a gate signal S1, as shown in FIG. 7, the transistor 23 is turned ON to apply a positive voltage to the gate of the IGBT 27 through the DC power source 21→the transistor 23→the gate-ON resistor 25. As a result, the IGBT 27 is turned ON. At this time, the turn-ON rate of the IGBT 27 is determined by a time constant of the gate-ON resistor 25 and the parasitic capacitor Cge of the IGBT 27.

When an "L" is inputted as the gate signal S1, on the other hand, the transistor 24 is turned ON so that a negative voltage is applied to the gate of the IGBT 27 via a route of the DC power source 22→the emitter of the IGBT 27→the gate of the IGBT 27→the gate-OFF resistor 26→the transistor 24. As a result, the IGBT 27 is turned OFF. At this time, the turn-OFF rate of the IGBT 27 is determined by a time constant of the gate-OFF resistor 26 and the parasitic capacitor Cge of the IGBT 27.

Here, the capacitor 28B is a capacitor having a sufficiently larger capacitance than that of the gate-emitter capacitor Cge of the IGBT 27. Moreover, the capacitor 28B is always charged with a voltage equal to that of the DC power source 21 by the leakage current through the emitter-collector of the transistor 28A.

For example, the collector current of the IGBT 27 becomes excessive so that this increase in the collector current leads to an increase in the collector-emitter voltage VCE and accordingly in the gate voltage VGE, as has been described hereinbefore. In this case, the voltage of the DC power source 21 and the gate voltage VGE are compared by the comparator 28D. When the gate voltage VGE exceeds the voltage of the DC power source 21, the output of the comparator 28D is set to the "L" level to turn ON the transistor 28A. At this time, the capacitor 28B is charged with the voltage of the DC power source 21 so that the gate voltage VGE is kept at the voltage of the DC power source 21. As a result, the gate voltage VGE does not exceed the voltage of the DC power source 21 so that the collector current is suppressed to such a current value as can be fed by the gate voltage determined by the DC power source 21.

Where the IGBT is applied to an inverter or the like, on the other hand, it is an important item to suppress the generation loss lowly. It is, therefore, necessary to drop the collector-emitter saturation voltage VCE (sat) of the IGBT. However, the collector-emitter saturation voltage VCE (sat) and the collector saturation current of the IGBT have the trade-off relation, as shown in FIG. 8. If the collector-emitter saturation voltage VCE (sat) is set low for the same gate voltage, therefore, there are increased the collector current (i.e., the collector saturation current) to be fed. Where the collector-emitter saturation voltage VCE (sat) is thus set low, the short-circuit resistance of the IGBT may be exceeded. In order to keep the short-circuit resistance, therefore, it is seriously difficult to drop the collector-emitter saturation voltage VCE (sat) to a predetermined or lower level.

In the prior art example thus far described, therefore, it is necessary for protecting the IGBT from the short-circuit current to set the collector-emitter saturation voltage VCE (sat) at the predetermined or higher level. This necessity makes it difficult to create an IGBT having a small loss and a large short-circuit resistance and accordingly to reduce the loss of the inverter device.

As the technique for protecting the IGBT against the short-circuit current, on the other hand, there is the prior art, as shown in FIG. 9, which is disclosed in Japanese Patent Laid-Open No. 79758/1992 or 139578/1996. In this prior art, there is adopted a method, by which the gate voltage is dropped, when a short-circuit current is detected, through a resistor Rg connected in series with a gate. In this prior art, after a gate voltage Vg is lowered, the gate-emitter voltage of the IGBT drops for the time period which is determined by the time constant of the gate-emitter capacitor Cge and the gate resistor Rg of the IGBT. As illustrated in FIG. 10, there is caused a delay Td1 till the gate voltage begins to drop and till the collector voltage begins to rise after the short-circuit current was detected. At this time, the short-circuit current continues to rise but then begins to drop with a delay Td2 after the collector voltage rose. Therefore, the short-circuit current does not drop before a delay of Td1+Td2 has passed after the short-circuit current was detected. Therefore, the short-circuit current has risen to such an extremely high value as may exceed the short-circuit resistance of the IGBT. Hence, there is a danger that the IGBT is broken.

This invention has been conceived to solve the aforementioned problems and has an object to provide a power module which is enabled to protect a self arc-extinguishing type semiconductor against a short-circuit current to flow through the collector-emitter of the semiconductor, even if the semiconductor is set with a low collector-emitter saturation voltage VCE (sat), by suppressing the peak value of the short-circuit current.

DISCLOSURE OF THE INVENTION

According to this invention, there is provided a power module comprising: a self arc-extinguishing type semiconductor having a current detecting emitter; and a short-circuit current suppressing circuit for turning OFF said self arc-extinguishing type semiconductor when a short-circuit current flows through the collector-emitter of said self arc-extinguishing type semiconductor, wherein said short-circuit current suppressing circuit includes: detection means for detecting said short-circuit current by detecting a current to flow through said current detecting emitter when the short-circuit current flows through the collector-emitter of said self arc-extinguishing type semiconductor; and a series member having a semiconductor switch and a capacitor and connected at its one terminal with the gate of said self arc-extinguishing type semiconductor and at its other terminal with the negative electrode of a power source connected at its positive electrode with the emitter of said self arc-extinguishing type semiconductor, and wherein said semiconductor switch is turned ON when said short-circuit current is detected by said detection means. When the short-circuit current flows through the collector-emitter of the IGBT, therefore, its peak value can be suppressed.

Moreover, said self arc-extinguishing type semiconductor is turned OFF a predetermined time after said semiconductor switch was ON. When the IGBT is turned OFF, therefore, the current to flow through the collector-emitter of the IGBT can be prevented from dropping abruptly.

Moreover, said short-circuit current suppressing circuit includes a resistor connected in parallel with the capacitor and having such a resistance that the gate-emitter voltage of said self arc-extinguishing type semiconductor when said self arc-extinguishing type semiconductor is turned OFF may be higher than the threshold voltage of said self arc-extinguishing type semiconductor. Therefore, the current to flow through the collector-emitter of the IGBT when this IGBT is turned OFF can be suppressed no more than the short-circuit resistance.

Moreover, said short-circuit current suppressing circuit includes a predetermined voltage diode connected in parallel with the capacitor and having such a resistance that the gate-emitter voltage of said self arc-extinguishing type semiconductor when said self arc-extinguishing type semiconductor is turned OFF may be higher than the threshold voltage of said self arc-extinguishing type semiconductor. Therefore, the current to flow through the collector-emitter of the IGBT when this IGBT is turned OFF can be suppressed no more than the short-circuit resistance.

Moreover, said series member further includes a resistor connected in series with the capacitor. When the semiconductor switch is turned ON, therefore, it is possible to prevent the current to flow through the collector-emitter of the IGBT from dropping abruptly.

BEST MODE FOR CARRYING OUT THE INVENTION

The present invention will be described in more detail with reference to the accompanying drawings.

Figure 1:
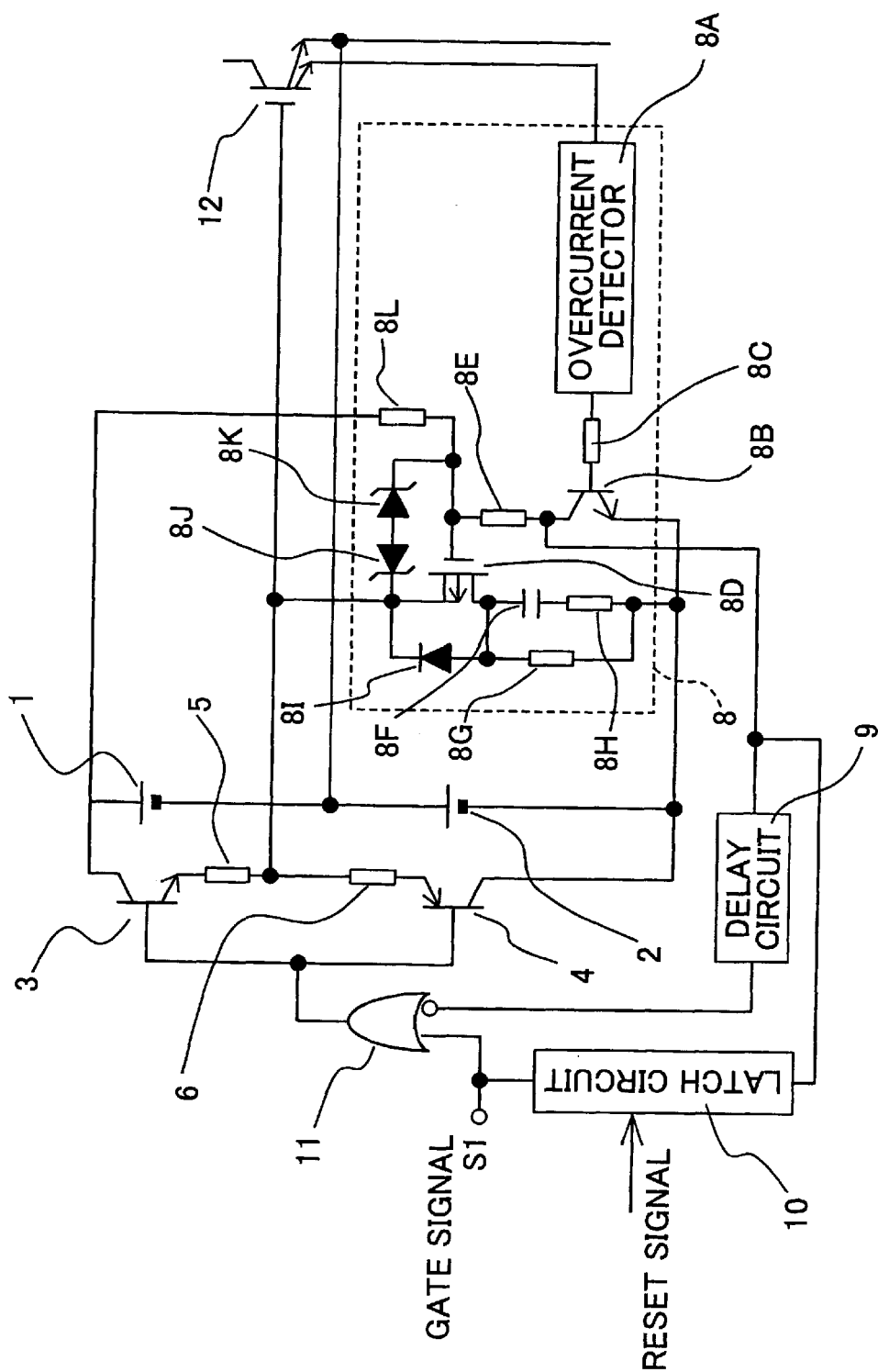
FIG. 1 is a circuit diagram of an essential portion showing an intelligent power module according to Embodiment 1 of this invention.

FIG. 1 is a circuit diagram of an essential portion showing an intelligent power module according to Embodiment 1 of this invention. In FIG. 1: reference numeral 12 designates an IGBT equipped with a detecting emitter; numeral 1 a DC power source (having a supply voltage Eon) for applying a positive voltage to the gate when the IGBT 12 is ON; numeral 2 a DC power source (having a supply voltage Eoff) for applying a negative voltage to the gate when the IGBT 12 is OFF; numeral 3 a transistor for applying a positive voltage to the gate of the IGBT 12 when ON; numeral 4 a transistor for applying a negative voltage to the gate of the IGBT 12 when ON; numeral 5 a gate-ON resistor (having a resistance Ron) for determining a gate voltage rising rate when the IGBT 12 is turned ON; and numeral 6 a gate-OFF resistor (having a resistance Ron) for determining a gate voltage dropping rate when the IGBT 12 is turned OFF.

Numeral 8A designates an overcurrent detector for detecting a detection current IS of the IGBT to output "H" when exceeding a preset overcurrent level; numeral 8B a transistor to be turned ON when the overcurrent detector 8A detects an overcurrent; numeral 8C a drive resistor of the transistor 8B; numeral 8D a MOSFET to be turned ON when the transistor 8B is turned ON; numeral 8E a resistor for suppressing the collector current of the transistor 8B; numeral 8F a capacitor having a voltage of 0 V at an ordinary time; numeral 8G a resistor (having a resistance Rcnt); numeral 8H a resistor connected in series with the capacitor 8F; numeral 8I a diode; numerals 8J and 8K Zener diodes for protecting the gate-source voltage of the MOSFET 8D; numeral 8L a resistor; and numeral 8 a short-circuit current suppressing circuit composed of the aforementioned 8A to 8L.

Numeral 9 designates a delay circuit for outputting the H with a delay of a constant time and for keeping its state, when the transistor 8B is turned ON to take a collector voltage L; numeral 10 a latch circuit for keeping its state, when an overcurrent is detected, and for releasing the state when a reset signal is inputted; and numeral 11 an OR circuit for feeding a gate signal S1 to the transistors 3 and 4, when the output of the delay circuit 9 is the H, and for feeding the L to the transistors 3 and 4 when the output of the delay circuit 9 is the L.

Figure 2:
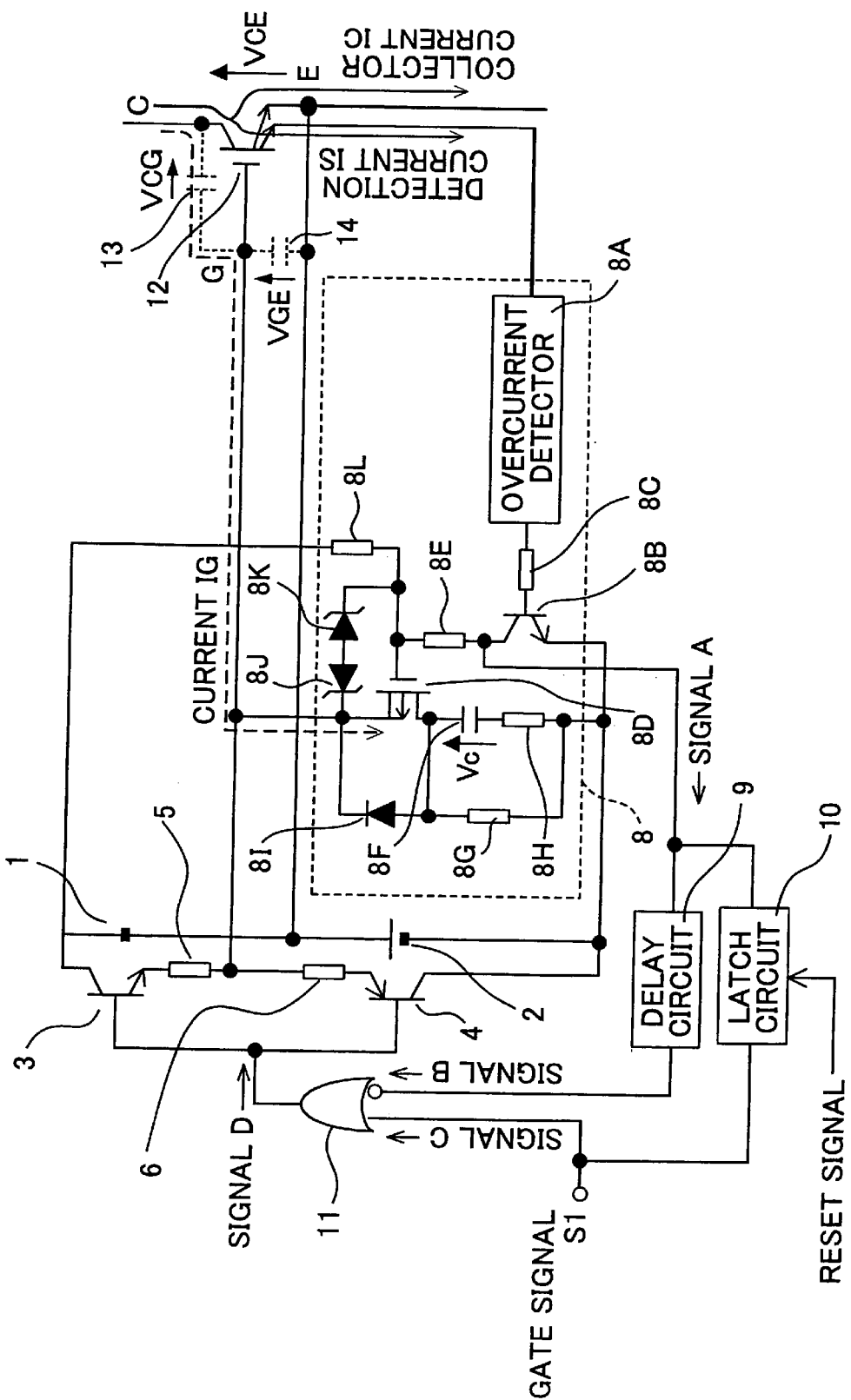
FIG. 2 is an explanatory diagram for explaining the actions of the intelligent power module shown in FIG. 1, when a short-circuit current flows through an IGBT.

On the other hand, FIG. 2 is an explanatory diagram for explaining the actions when a short-circuit current flows through the intelligent power module shown in FIG. 1. In FIG. 2, numeral 13 designates a parasitic capacitor between the collector-gate of the IGBT 12, and numeral 14 designates a parasitic capacitor between the gate-emitter of the IGBT 12.

On the other hand, a signal A is a signal outputted from the transistor 8B and inputted to the delay circuit 9 and the latch circuit 10, and is identical to the collector potential of the transistor 8B. A signal B is a signal inputted from the delay circuit 9 to the OR circuit 11, and a signal C is the gate signal S1 or a signal outputted from the latch circuit 10 and inputted to the OR circuit 11. On the other hand, a signal D is a signal outputted from the OR circuit 11 on the basis of the signals B and C.

On the other hand: letters Vc designate a charging voltage of the capacitor 8F; letters VCE a collector-emitter voltage of the IGBT 12; letters VCG a collector-gate voltage of the IGBT 12; letters VGE a gate-emitter voltage of the IGBT 12; letters IC a collector-emitter current of the IGBT 12; letters IS a detection current to flow from the current detecting emitter of the IGBT 12; and letters IG a current to flow, when the MOSFET 8D is ON, from the collector through the gate of the IGBT 12 to the MOSFET 8D.

Figure 3:
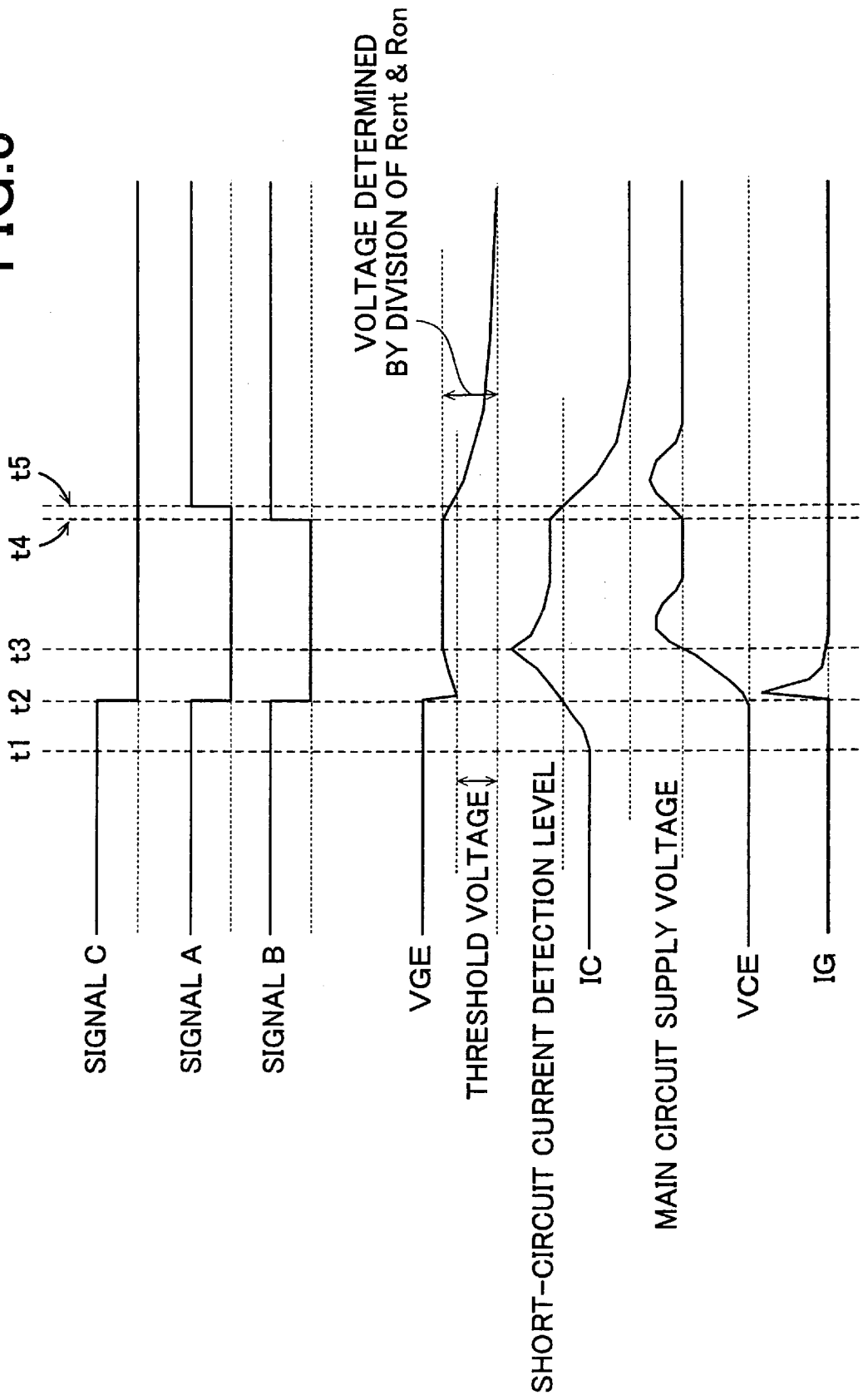
FIG. 3 is a waveform diagram of signals A, B and C, voltages VGE and VCE and currents IC and IG when the short-circuit current flows through the IGBT of the intelligent power module shown in FIG. 1.

On the other hand, FIG. 3 is a waveform diagram of the signals A, B and C, the voltages VGE and VCE, and the currents IC and IG when the short-circuit current flows through the intelligent power module shown in FIG. 1.

With reference to FIGS. 2 and 3, here will be described the actions of the intelligent power module according to Embodiment 1 shown in FIG. 1.

First of all, when the IGBT 12 is OFF, the collector current IC does not flow so that the overcurrent detector 8A does not detect the overcurrent but has the output "L". Therefore, the transistor 8B is OFF so that the signal A and the signal B are the "H". In this state, with the gate signal S1 being ON and the signal C being "H", the transistor 3 has its base driven by the signal D so that it is turned ON. At this time, the voltage VGE is applied from the gate to the emitter of the IGBT 12 via a route of the positive electrode of the DC power source 1→the transistor 3→the gate-ON resistor 5→the gate of the IGBT 12→the emitter of the IGBT 12→the negative electrode of the DC power source 1. In other words, the gate potential of the IGBT 12 is at the same potential as that of the positive electrode of the DC power source 1, and the emitter potential of the IGBT 12 is at the same potential as that of the negative electrode of the DC power source 1, so that the supply voltage Eon of the DC power source 1 is applied as the voltage VGE. Therefore, the IGBT 12 is turned ON. At this time, the collector current IC, as determined by the (not-shown) load resistor and the (not-shown) main circuit power source, flows from the collector to the emitter of the IGBT 12.

On the other hand, the transistor 8B is OFF so that the gate potential of the MOSFET 8D is at the same potential as that of the positive electrode of the DC power source 1, and the transistor 3 is ON so that the source of the MOSFET 8D is at the same potential as that of the positive electrode of the DC power source 1. As a result, the MOSFET 8D is OFF. Therefore, no voltage is applied to the two ends of the resistor 8G, and the voltage Vc of the capacitor 8F is 0 V.

Next, at an instant t1 when the load is short-circuited by some cause, the collector current IC begins to rise.

At an instant t2, moreover, the current IC exceeds a preset overcurrent detection level so that the overcurrent detector 8A detects the overcurrent. Then, the output of the overcurrent detector 8A becomes the "H", and the transistor 8B is turned ON. Here, the transistor 3 is ON. Therefore, the source of the MOSFET 8D is at the same potential as that of the positive electrode of the DC power source 1, and the gate of the MOSFET 8D is at the same potential as that of the negative electrode of the DC power source 2, so that the voltage of Eon +Eoff is applied from the source to the gate to turn ON the MOSFET 8D. At this time, the voltage of the capacitor 8F is 0V so that the gate potential VGE drops instantly.

Here, the Zener diode 8J is provided for such a protective purpose that the source-emitter applied voltage of the MOSFET 8D may not then exceed an allowable voltage.

Moreover, the MOSFET 8D is turned ON so that the current IG flows from the collector of the IGBT 12→the collector-gate capacitor 13→the MOSFET 8D→the capacitor 8F→the resistor 8H→the DC power source 2→the emitter of the IGBT 12. As a result, the collector-gate capacitor 13 and the capacitor 8F are charged so that the voltages VCG and Vc rise.

As the voltage VCG rises, the collector-emitter voltage VCE of the IGBT 12 likewise rises. Therefore, the rising rate of the voltage VCG, i.e., the rising rate (dVce/dt) of the voltage VCE is determined by the following Formula, in the case where the capacity of the capacitor 8F is sufficiently large for the capacity of the collector-gate parasitic capacitor 13:

$dVce/dt$=Current $IG$/Capacity of Capacitor 13.

As the resistance of the resistor 8H is the lower, therefore, the rising rate (dVce/dt) of the VCE becomes the higher. Here, the resistor 8H is provided for preventing the current IC to flow through the collector-emitter of the IGBT 12 from abruptly dropping when the MOSFET 8D is turned ON.

Simultaneously as the transistor 8B is turned ON, on the other hand, the signal A and the signal B become the "L". Moreover, the signal C is made to become the "L" by the action of the latch circuit 10. Here, the delay circuit 9 is so set that it becomes the "H" a predetermined period once it became the "L". Here, the signal B is the "L" so that the signal D keeps the "H" state independently of the state of the signal C, and so that the transistor 3 is kept ON.

Next, it is assumed that, at an instant t3, the voltage VCE rises so that the voltage of the (not-shown) main circuit power source is equalized to the voltage VCE. Then, the short-circuit current IC cannot flow any more but begins to decrease.

At this time, the transistor 3 is kept ON, as described above, so that the gate-emitter voltage VGE of the IGBT 12 takes such a voltage as is made by dividing the voltages Eon and Eoff by resistances Ron and Rcnt. Specifically, the voltage VGE at this time takes a value expressed by the following Formula:

$$VGE=(Eon+Eoff) \times Rcnt/(Ron+Rcnt)-Eoff.$$

Figure 4:
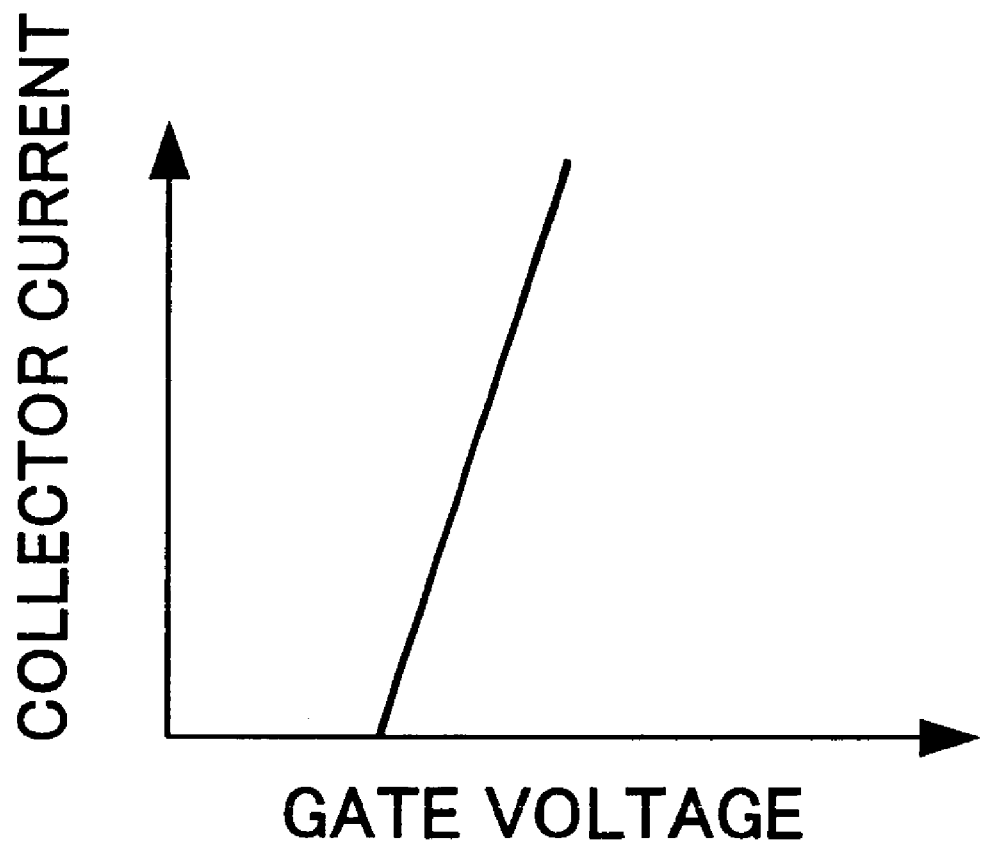
FIG. 4 is a characteristic diagram illustrating a relation between a gate voltage and a collector current in the IGBT.

By selecting the Rcnt so that the voltage VGE may have a value slightly higher than the threshold voltage of the IGBT 12, the IGBT 12 is not turned OFF, but the constant collector current IC determined by the gate voltage VGE is kept from the relation shown in FIG. 4.

FIG. 4 illustrates the relation between the gate voltage VGE and the collector current IC. As shown, the collector current IC of the IGBT 12 is limited to the current which is determined by the gate voltage VGE. By selecting the resistance Rcnt of the resistor 8G, therefore, the short-circuited excessive current can be lowered to the turn-OFF current level without turning OFF the IGBT 12. Here, the charging voltage Vc of the capacitor 8F is fixed at the voltage, as expressed by:

$$Vc=(Eon \times Eoff) \times Rcnt/(Ron+Rcnt).$$

Next, at an instant t4, the signal B becomes the "H" after a constant period determined by the delay circuit 9. Then, the signal C is already fixed at the "L" so that the signal D becomes the "L" to turn ON the transistor 4. As a result, the electric charge stored in the capacitor 8F and the electric charge stored in the gate-emitter capacitor 14 are individually released through the gate-OFF resistor 6→the transistor 4. In short, the IGBT 12 is turned OFF.

At the ordinary time when the IGBT 12 is turned OFF, the gate voltage VGE drops with the time constant which is determined only by the gate-emitter capacitor 14 and the Roff. In the present embodiment, however, the time constant is determined by the apparent parallel capacitors of the gate-emitter capacitor 14 and the capacitor 8F and the Roff, so that the drop time of the gate voltage VGE is delayed. As compared with the ordinary turn-OFF time, therefore, the gate voltage VGE drops at the gentle dropping rate (dVGE/dt) so that the dropping rate (dIC/dt) of the collector current IC flowing through the IGBT 12 also becomes gentle.

By the dropping rate (dIC/dt) of the current IC at the turn-OFF time, a surge voltage is generated in the (not-shown) main circuit floating inductance and is applied to the collector-emitter of the IGBT 12. In the present embodiment, however, the dropping rate (dIC/dt) is so low to drop the surge voltage that the IGBT 12 can be prevented from being broken by the voltage.

At an instant t5, moreover, the current IC having gently dropped becomes lower than the short-circuit current detection level so that the transistor 8B is turned OFF by the overcurrent detector 8A.

Here, after the series of protecting actions were ended, the reset signal is inputted to the latch circuit 10 so that the "L" state can be released to start the next ON/OFF actions.

According the present embodiment, as has been described hereinbefore, the MOSFET 8D is turned ON just after the short-circuit current was detected, so that the current is drawn from the collector to the gate of the IGBT 12 to raise the voltage VCE abruptly. Therefore, the peak of the short-circuit current can be instantly suppressed, and the collector current IC can be suppressed sufficiently low at the turn-OFF time of the IGBT 12 till the IGBT 12 can act safely. Moreover, the dropping rate (dIC/dt) of the current IC at the turn-OFF time so that the IGBT 12 can be safely protected from being short-circuited.

Therefore, even the IGBT, as set with an extremely low collector-emitter saturation voltage VCE (sat), for example, can be protected from the short-circuit current to reduce the generation loss of the IGBT.

Figure 5:
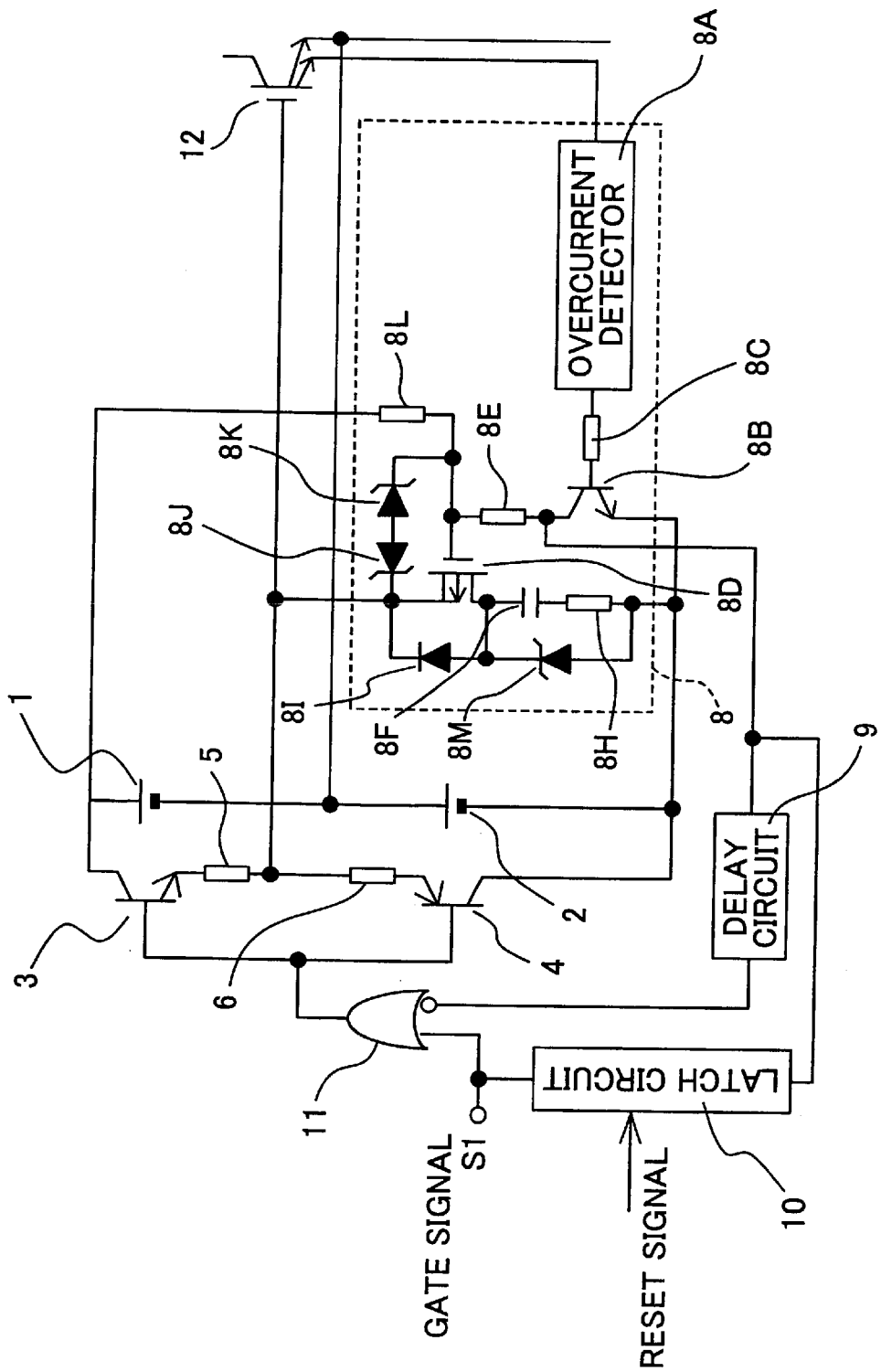
FIG. 5 is a circuit diagram of an essential portion showing an intelligent power module according to Embodiment 2 of this invention.
Figure 6:
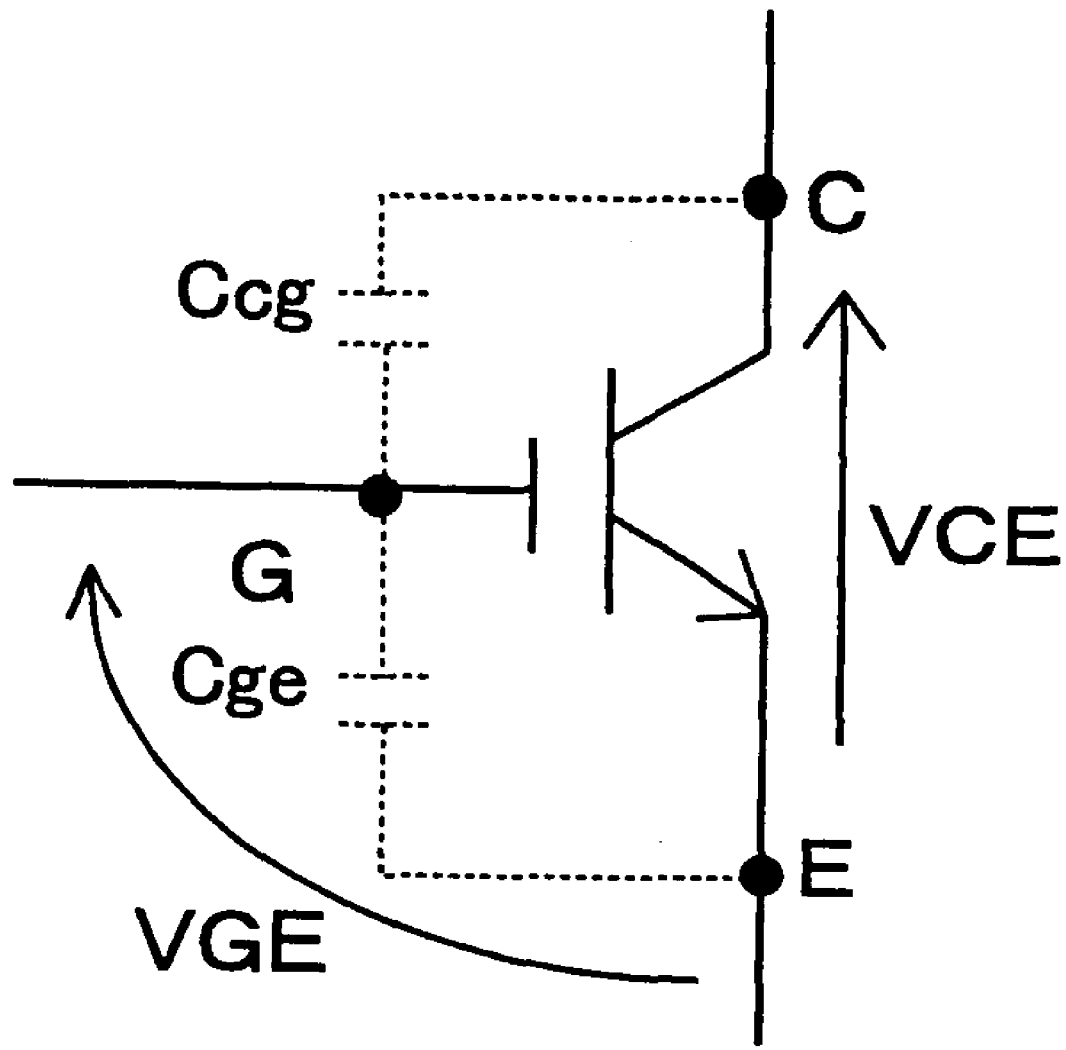
FIG. 6 is a diagram showing an IGBT which is equipped with parasitic capacitors individually between its collector and gate and between its gate and emitter.
Figure 7:
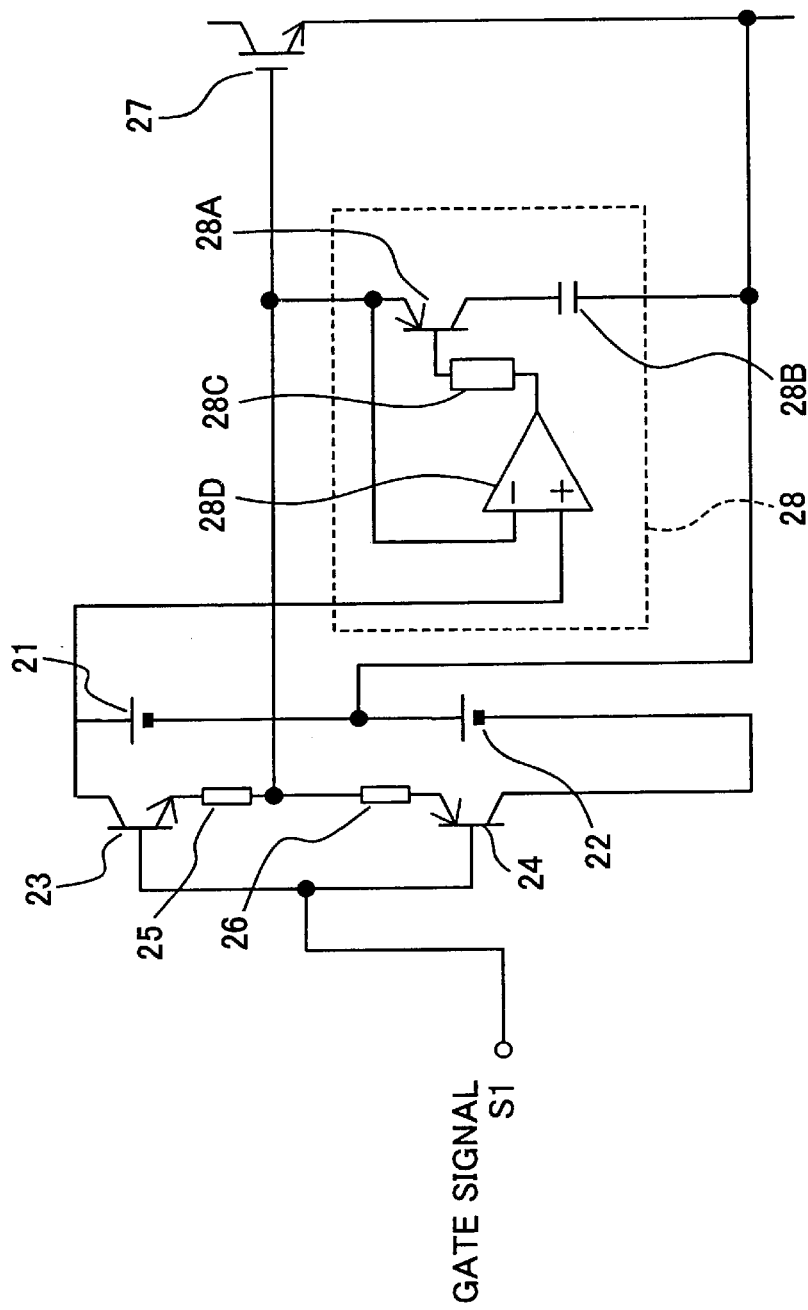
FIG. 7 is a circuit diagram of an essential portion showing a protective circuit of an IGBT of the prior art.
Figure 8:
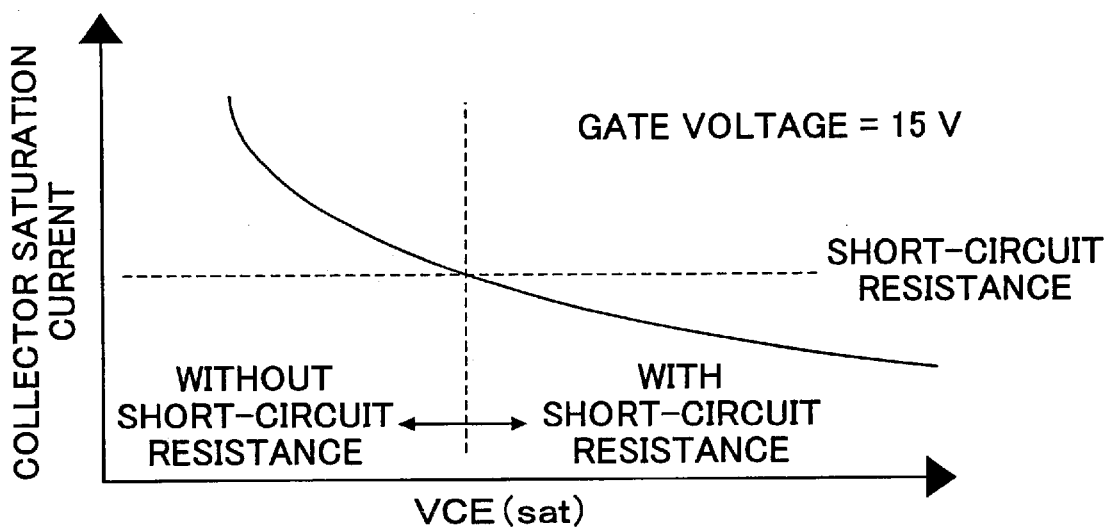
FIG. 8 is a characteristic diagram illustrating a relation between a collector-emitter saturation voltage and a collector saturation current in the IGBT.
Figure 9:
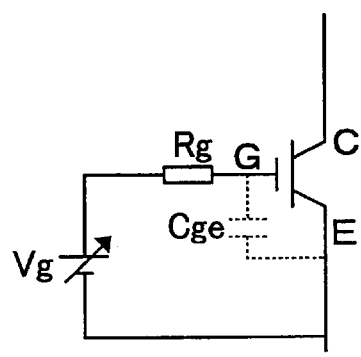
FIG. 9 is a circuit diagram of an essential portion showing a protective circuit of another IGBT of the prior art.
Figure 10:
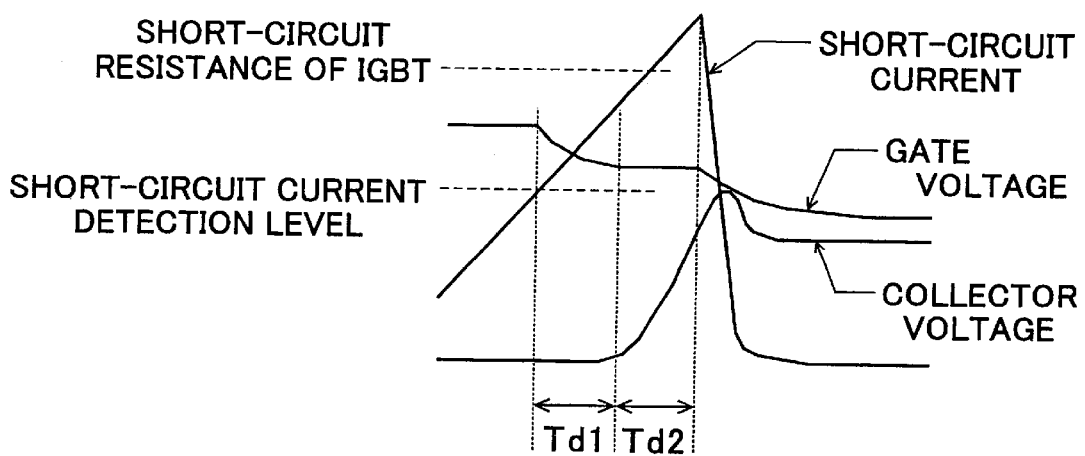
FIG. 10 is a waveform diagram of a short-circuit current, a gate voltage and a collector current in the protective circuit of the IGBT shown in FIG. 9.

FIG. 5 is a circuit diagram of an essential portion showing Embodiment 2 of this invention. Numeral 8M designates a Zener diode. In this embodiment, the resistor 8G of Embodiment 1 is replaced by the Zener diode 8M. By setting the voltage of the Zener diode 8M at a level slightly higher than the threshold voltage of the IGBT 12, it is possible to attain effects similar to those of Embodiment 1. In Embodiment 1, the gate voltage VGE at the short-circuit current ON time is determined by the voltage division of the gate-ON resistor 5 and the resistor 8G. By raising the gate voltage VGE to a level slightly higher than the threshold voltage by utilizing the breakdown voltage of the Zener diode 8M, however, it is possible to realize actions similar to those of Embodiment 1.

INDUSTRIAL APPLICABILITY

As has been described hereinbefore, the power module according to the present invention is suited for protecting the IGBT having the low collector-emitter saturation voltage VCE (sat) and the low short-circuit breakdown, against the short-circuit current.

What is claimed is:

1. A power module comprising: a self arc-extinguishing type semiconductor having a current detecting emitter; and a short-circuit current suppressing circuit for turning OFF said self arc-extinguishing type semiconductor when a short-circuit current flows through the collector-emitter of said self arc-extinguishing type semiconductor, wherein said short-circuit current suppressing circuit includes:
      detection means for detecting said short-circuit current by detecting a current to flow through said current detecting emitter when the short-circuit current flows through the collector-emitter of said self arc-extinguishing type semiconductor; and
      a series member having a semiconductor switch and a capacitor and connected at its one terminal with the gate of said self arc-extinguishing type semiconductor and at its other terminal with the negative electrode of a power source connected at its positive electrode with the emitter of said self arc-extinguishing type semiconductor, and
         wherein said semiconductor switch is turned ON when said short-circuit current is detected by said detection means.

2. A power module according to claim 1, wherein said self arc-extinguishing type semiconductor is turned OFF a predetermined time after said semiconductor switch was ON.

3. A power module according to claim 2, wherein said short-circuit current suppressing circuit includes a resistor connected in parallel with the capacitor and having such a resistance that the gate-emitter voltage of said self arc-extinguishing type semiconductor when said self arc-extinguishing type semiconductor is turned OFF may be higher than the threshold voltage of said self arc-extinguishing type semiconductor.

4. A power module according to claim 2, wherein said short-circuit current suppressing circuit includes a predetermined voltage diode connected in parallel with the capacitor and having such a breakdown voltage that the gate-emitter voltage of said self arc-extinguishing type semiconductor when said self arc-extinguishing type semiconductor is turned OFF may be higher than the threshold voltage of said self arc-extinguishing type semiconductor.

5. A power module according to claim 1, wherein said series member further includes a resistor connected in series with the capacitor.

* * * * *